(12) United States Patent
Chang

(10) Patent No.: US 6,933,437 B1
(45) Date of Patent: Aug. 23, 2005

(54) SHIELDING APPARATUS FOR ELECTRONIC DEVICE

(75) Inventor: Hui-Tsang Chang, Hsinchu (TW)

(73) Assignee: Arcadyan Technology Corporation, Hsinchu (TW)

( * ) Notice: Subject to any disclaimer, the term of this patent is extended or adjusted under 35 U.S.C. 154(b) by 0 days.

(21) Appl. No.: 10/833,788

(22) Filed: Apr. 27, 2004

(30) Foreign Application Priority Data

Mar. 2, 2004 (TW) ............................ 93105347 A

(51) Int. Cl.7 ............................................. H05K 9/00
(52) U.S. Cl. ...................... 174/35 C; 361/816; 361/818
(58) Field of Search ........................ 174/35 R, 35 GC, 174/35 C, 35 MS; 361/712, 720, 722, 753, 361/799, 800, 816, 818; 439/92, 95

(56) References Cited

U.S. PATENT DOCUMENTS 4,605,058 A * 8/1986 Wilens ....................... 165/80.2
5,031,028 A * 7/1991 Galich et al. ................ 257/659
6,580,028 B1 * 6/2003 Mellberg et al. ........... 174/35 R

* cited by examiner

Primary Examiner—Dean A. Reichard
Assistant Examiner—Carmelo Oliva
(74) Attorney, Agent, or Firm—J.C. Patents

(57) ABSTRACT

A shielding apparatus for an electric device comprises a first lead, a second lead and an inverted U-shaped cover, constituting a metallic inserting component. The first and second leads insert into two sides of the electric device, respectively, and electrically connect with a ground terminal of a circuit board. The inverted U-shaped cover contacts with the top of a metallic shell of the electric device and clips on the two sides of the metallic shell. Functionally, the metallic inserting component can reduce noises from electromagnetic interference, and tightly fix on the metallic shell without electrical welding so that the reliability of assembly will be improved.

8 Claims, 5 Drawing Sheets

SHIELDING APPARATUS FOR ELECTRONIC DEVICE

CROSS-REFERENCE TO RELATED APPLICATION

This application claims the priority benefit of Taiwan application serial no. 93105347, filed on Mar. 2, 2004.

BACKGROUND OF THE INVENTION

1. Field of the Invention

The present invention relates to a shielding apparatus for an electronic device, and more particularly to a shielding apparatus for an electronic device capable of reducing or eliminating electromagnetic interference.

2. Description of Related Art

A quartz oscillating device is composed of a quartz crystal, an oscillator and a clock generator. In the aspect of application, the quartz oscillating device can be soldered on the surface of the circuit board by the surface mount technology (SMT) or the plated through hole (PTH) technology for providing desired clock signals under a specific operational frequency to micro-processors or the other high-level or low-level micro-processing chips. Therefore, the quartz oscillating device can be widely applied to personal computers, portable computers, liquid crystal displays, high-level communication products, broadband network, such as ADSL, network hubs, 10/100 MHz switchers, routers and the other high-frequency products.

In the present population of electronic apparatus, a variety of quartz oscillators and voltage-controlled oscillators (VCO) are applied to the internal circuits of the electronic apparatus. All these electronic devices can be the sources of electromagnetic radiation. Therefore, it is desired to prevent electromagnetic interference for fitting the electromagnetic interference standard. The research and development of the quartz oscillating device with low electromagnetic interference (EMI) are essential in this industry to reduce noise/signal ratio and maintain high transmission quality.

FIGS. 1 and 2 are schematic drawings showing two prior art electronic devices for preventing EMI. Referring to FIG. 1, the electronic device 100, such as a quartz oscillating device or an oscillating devices vulnerable to EMI, is disposed on the surface of the circuit board 110 by the lead-inserting technology, such as DIP leads. The electronic device 100 is electrically connected to the circuit board 110 through the leads (not shown) by soldering for providing clock signals with accurate periodic oscillation as referential frequency or timing for micro-processors (not show). Additionally, the electronic device 100 has a metallic shell 102, such as a stainless-steel shell or an aluminum-alloy shell, for preventing electromagnetic radiation or the noises resulting form EMI. In order to preventing EMI, the prior art technology electrically connects the ground terminal of the electronic device 100, such as the metallic shell 102, and the ground terminal of the circuit board 110, such as the ground plate, by directly soldering 112 for reducing noises from EMI. Referring to FIG. 2, in the prior art technology, the ground terminal of the electronic device 100, such as the metallic shell 102, electrically connects with the ground terminal of the circuit board 10, such as the ground plate by welding the external lead 114 for reducing noises from EMI.

However, directly soldering 112 or welding the external lead 114 would generate high temperature, which could destroy the vibration stability of the quartz oscillating device as to generate substantial deviation. Additionally, the manual welding process need high costs, which does not meet economic requirement. The direct soldering method has the disadvantage that the adhesion of tin on the stainless-steel shell 102 is poor which would create the difficulty of manufacturing, low yield of the soldering contact 112 and looseness during oscillation tests. Therefore, the reliability of the assembly is substantially reduced.

SUMMARY OF THE INVENTION

Accordingly, the present invention is directed to a shielding apparatus for an electronic device for reducing noises resulting from electromagnetic interference and maintaining high transmission quality.

According to an embodiment of the present invention, the above shielding apparatus is capable of overcoming the problems, such as, difficulty in manufacturing, low soldering yield, lose in oscillation tests, and thereby to improve reliability of the assembly and reduce the overall manufacturing cost.

According to an embodiment of the present invention, a metallic inserting component for electrically connecting an electronic device and a circuit board is provided. The electronic device is disposed on the circuit board and has a metallic shell. The circuit board has a ground terminal. The metallic inserting component comprises a first lead and the circuit board has a first inserting hole corresponding thereto. The first lead is inserted into the first inserting hole and is electrically connected to the ground terminal of the circuit board by a solder. Additionally, a top of the metallic inserting component has a first cover, covering the top of the metallic shell.

According to an embodiment of the present invention, the shielding apparatus for the electronic device comprises: an electronic device and a metallic inserting component. The electronic device having a metallic shell is disposed on the circuit board. The surface of the metallic shell constitutes a ground surface of the electronic device. Additionally, the metallic inserting component comprises a first lead and a second lead, which are separately soldered on the ground terminal of the circuit board. The first and the second leads are located on two sides of the metallic shell of the electronic device. A top of the metallic inserting component has an inverted U-shaped cover, which connects the first and the second leads. The inverted U-shaped cover contacts the top of the metallic shell and clips on the two sides of the metallic shell.

According to an embodiment of the present invention, the materials of the first and the second leads as well as the inverted U-shaped cover can be comprised of tinplate, nickel silver copper or the other metal with good adhesion property to tin. Additionally, the connecting parts of the inverted U-shaped cover with the first and the second leads form a first clipping part and a second clipping part, which inwardly clip the two sides of the metallic shell.

The present invention uses the electronic device, which can be connected to external leads, and the shielding apparatus is adapted for reducing noises resulting from electromagnetic interference. Therefore, the embodiment can meet the electromagnetic interference standard. Additionally, the leads of the metallic component and the circuit board are soldered for electrical connection. The present invention does not use high-temperature soldering method or the method of welding external leads. The embodiment of the present invention would not destroy the oscillation stability of the quartz oscillating device. The stability of the assembly can also be improved.

In order to make the aforementioned and other objects, features and advantages of the present invention understandable, a preferred embodiment accompanied with figures is described in detail below.

DESCRIPTION OF EMBODIMENTS

Figure 1:
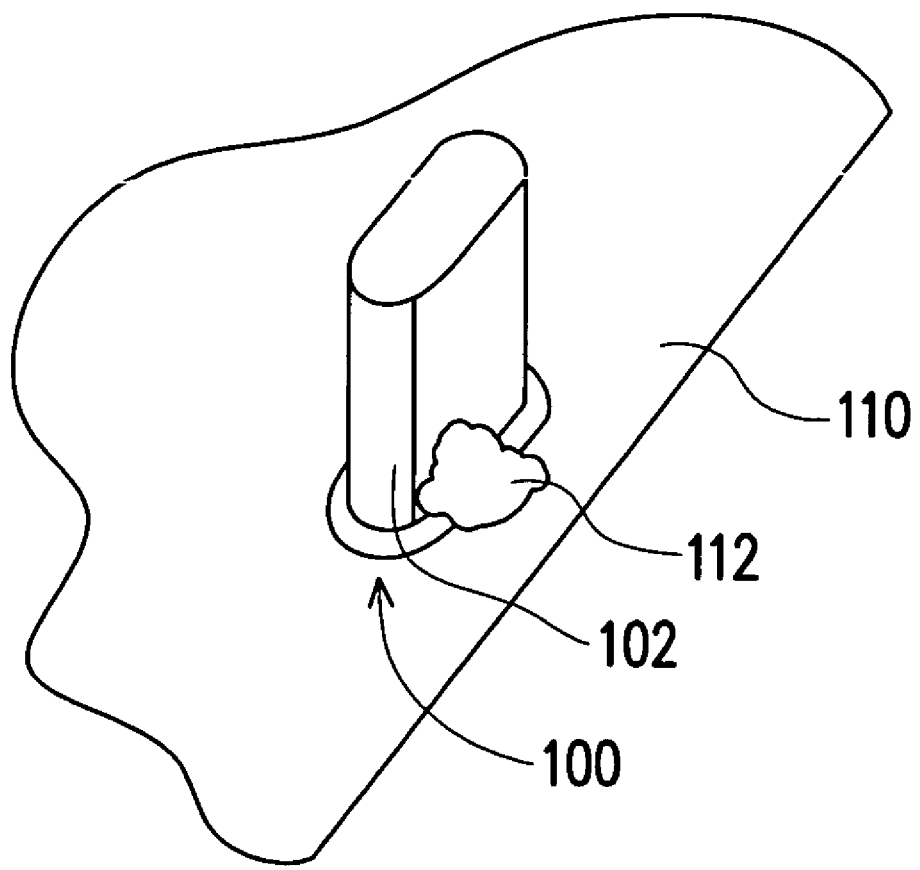
FIGS. 1 and 2 are schematic drawings showing two prior art electronic devices for preventing EMI.
Figure 2:
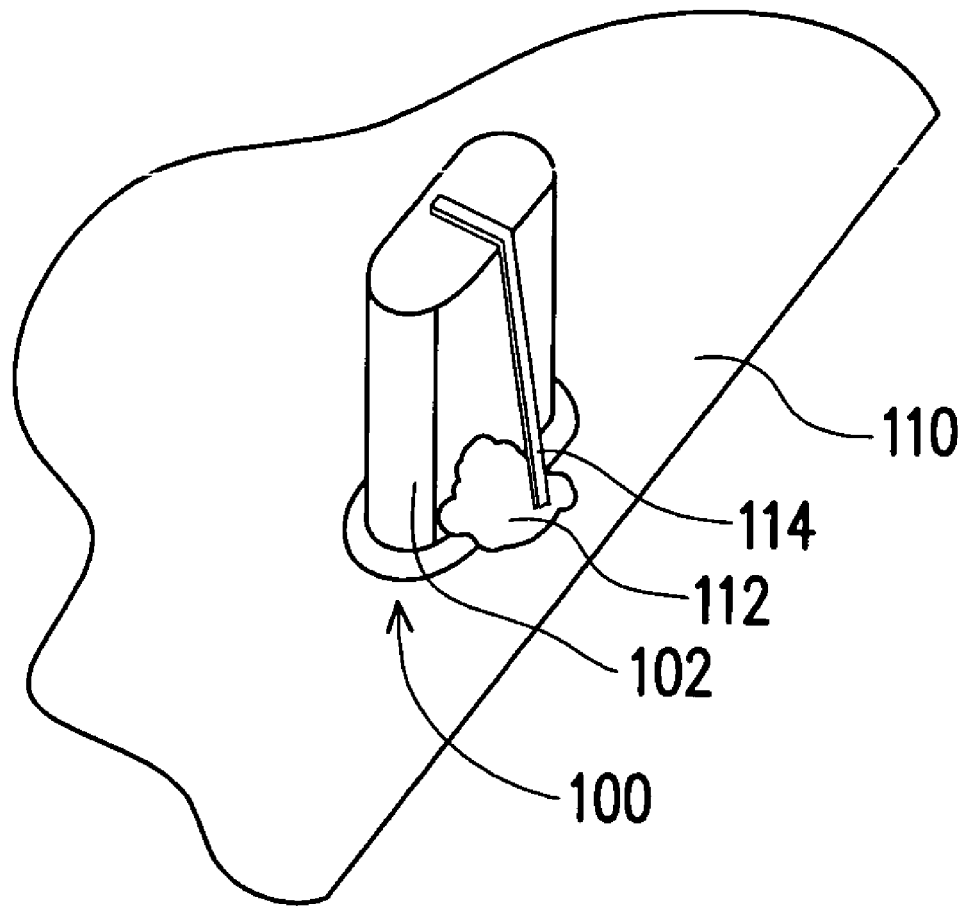
Figure 3A:
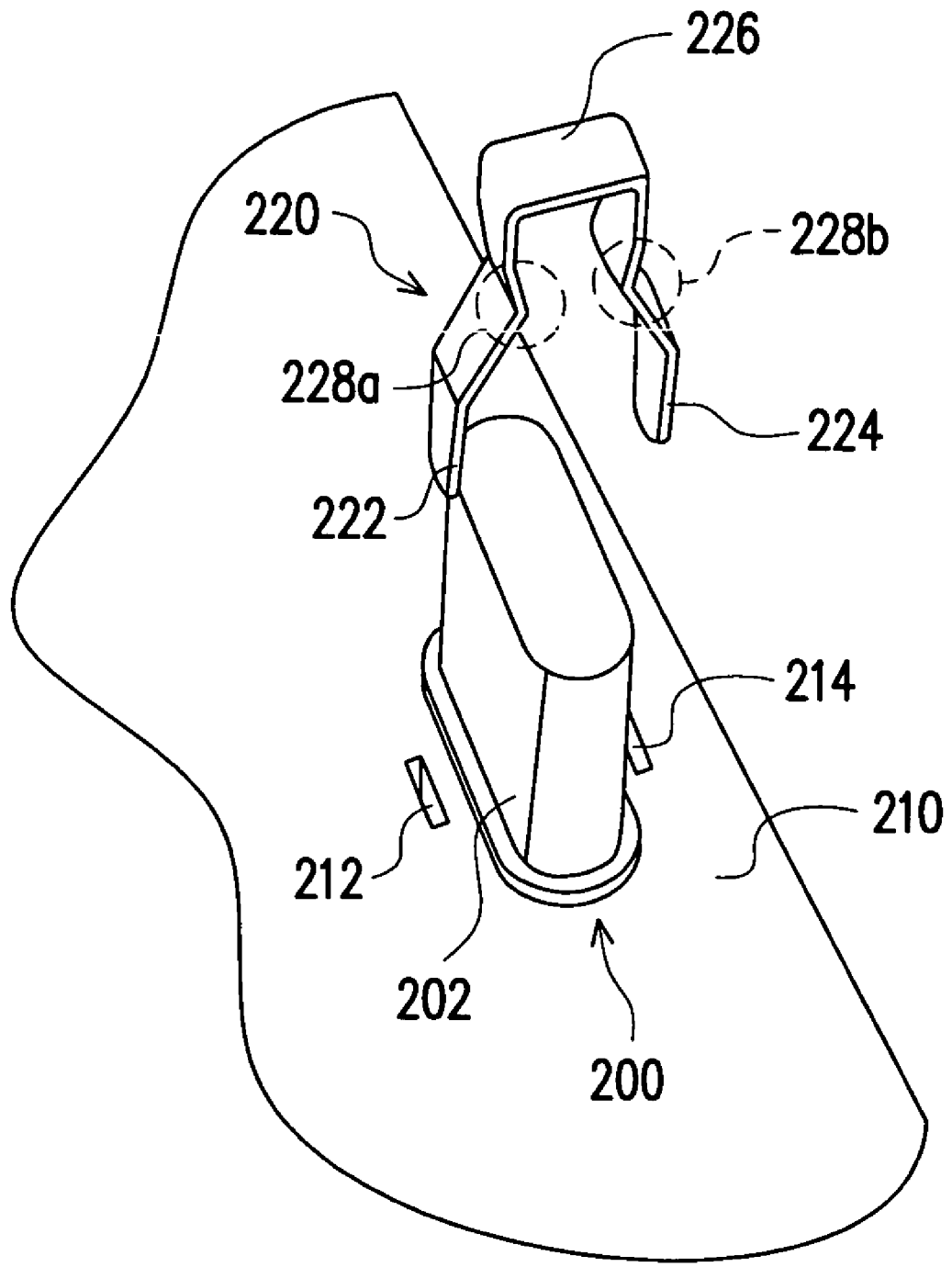
FIGS. 3A and 3B are schematic drawings showing an external metal inserting component before and after assembling, respectively.
Figure 3B:
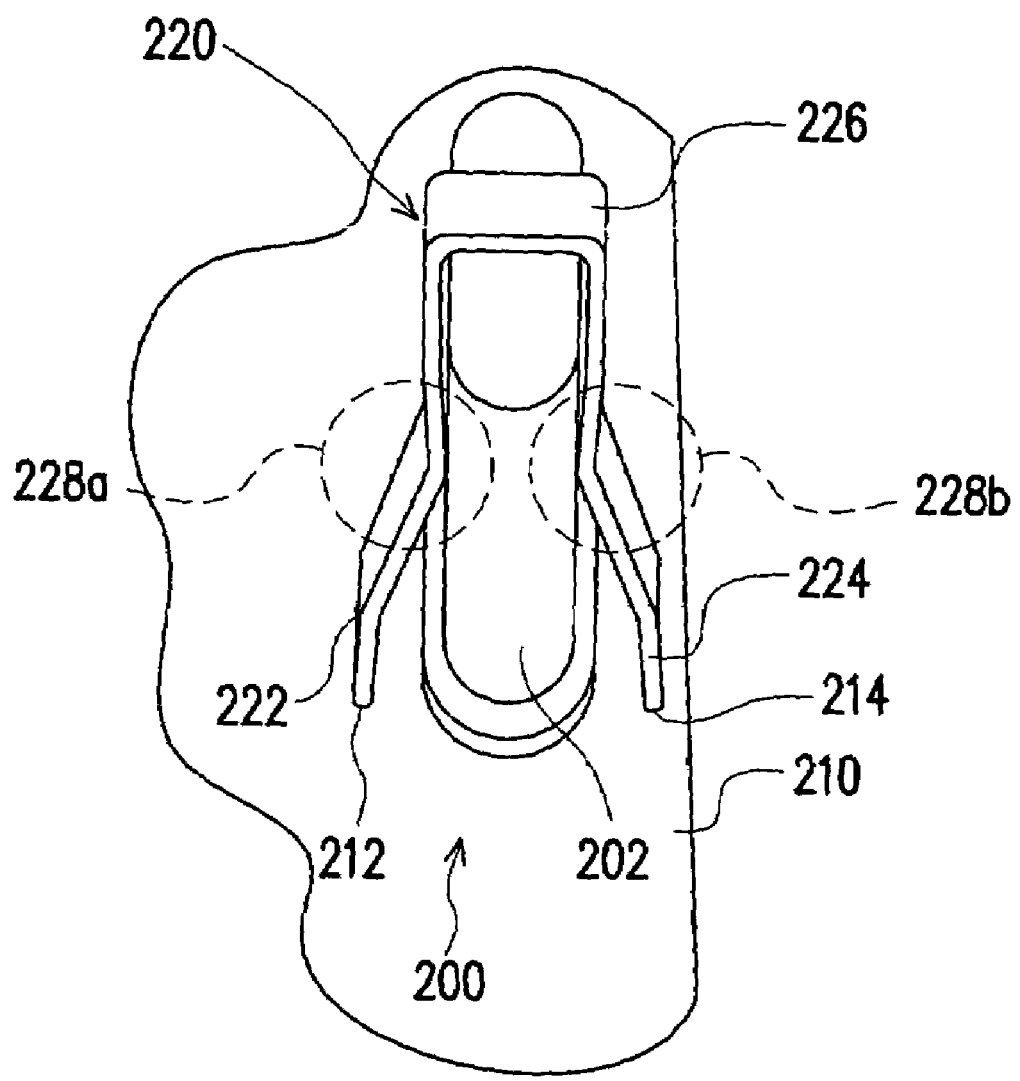

FIGS. 3A and 3B are schematic drawings showing an external metal inserting component before and after assembling, respectively. Referring to FIG. 3A, the electronic device 200 has a pillar metallic shell 202, comprising a material, such as stainless steel or aluminum alloy. The electronic device 200 can be, for example, a quartz oscillating device, an oscillating device vulnerable to electromagnetic interference, an active device or a passive device. The bottom of the electronic device is mounted on a circuit board 210, for example, by inserting leads (not shown) therein and soldering thereon, for providing clock signals with accurate periodic oscillation as referential frequency or timing for micro-processors (not show) and related circuits. The metallic shell 202 is capable of reducing or preventing the electromagnetic radiation and also shield noises. The surface of the metallic shell 202 can serve as the ground surface of the electronic device 200 for reducing noises resulting from electromagnetic interference. Additionally, in order to prevent electromagnetic interference, the embodiment uses an external metallic component 220, which can be disposed on the circuit board 210 and clips on two sides of the metallic shell 202 as shown in FIGS. 3A and 3B.

Referring to FIG. 3A, the bottom of the metallic component 220 comprises, for example, a first lead 222 and a second lead 224. The circuit board 210 comprises a first inserting hole 212 and a second inserting hole 214 corresponding thereto, which punch through the circuit board 210 adjacent to the two sides of the metal shell 202. The first and the second leads 222 and 224 are inserted in the first and the second inserting holes 212 and 214, respectively. The tips of the first and the second leads 222 and 224 extend over the bottom of the circuit board 210. Then, the tips of the first and the second leads 222 and 224 of the metallic inserting component 220 as well as the circuit board 210 are soldered for electrically connecting the first and the second leads 222 and 224 as well as the ground terminal of the circuit board 210. Therefore, the ground terminal of the electronic device 200, such as the metallic shell 202, electrically contacts with the ground terminal of the circuit board 210, such as the ground plate, by the external metallic inserting component 220 for reducing noises resulting from electromagnetic interference. In another aspect, the external metallic inserting component 220 is a low cost component and does not need high-temperature welding. The present invention can substantially reduce the manufacturing costs and processing time compared to the prior art manual welding or direct soldering operation. Moreover, it also resolves the low-yield issue as the result of poor soldering contact.

Referring to FIG. 3A, the top of the external metallic inserting component comprises, for example, an inverted U-shaped cover 226, which connects the first and the second leads 222 and 224, for forming a longitudinal symmetric metallic inserting component 220. The materials of the first and the second leads 222 and 224 as well as the inverted U-shaped cover 226 can be, for example, tinplate, nickel silver copper or the other metal with good adhesion to tin. The tinplate means a steel sheet coated with tin thereon. The nickel silver copper means an alloy with copper 50–70% and nickel 15–35%. Additionally, the inverted U-shaped cover 226 and the first and the second leads 222 and 224 can be formed as an integral unit or by appropriate manufacturing process for forming the shape as shown in FIG. 3A.

Referring to FIG. 3B, when the metallic inserting component 220 is disposed on the metal shell 202 of the electronic device 200, the inverted U-shaped cover covers the top of the metallic shell 202 and contacts the metallic shell 202. The connecting parts of the inverted U-shaped cover 226 with the first and the second leads form a first clipping part 228a and a second clipping part 228b, respectively, which inwardly clip on the two sidewalls of the metallic shell 202. By the clipping of the first and the second clipping parts 228a and 228b, the metallic inserting component 220 is prevented from coming loose during oscillation tests; the first and the second clipping parts 228a and 228b can tightly contact the sidewalls of the metallic shell 202 for forming good electrical connection.

Although the present invention uses the embodiment above as an example, the structure, shape or number of the metallic inserting component are not limited thereto. A variety of metallic inserting components can be applied thereto. As long as the metallic inserting component can be securely disposed on the metallic shell and electrically connected therewith, it will be within the scope of the present invention and protected thereby.

Figure 4A:
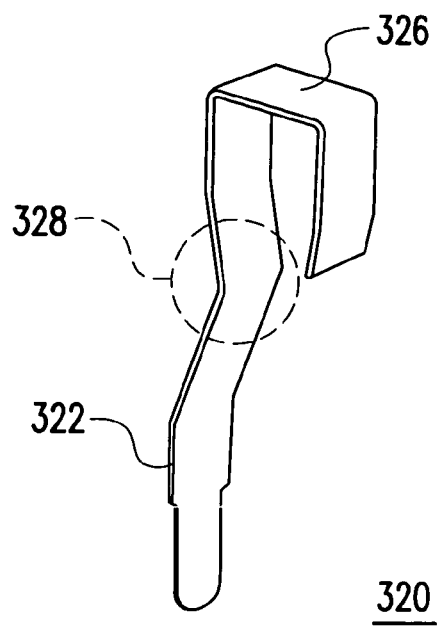
FIGS. 4A and 4B are schematic drawings showing another external metal inserting component before and after assembling, respectively.
Figure 4B:
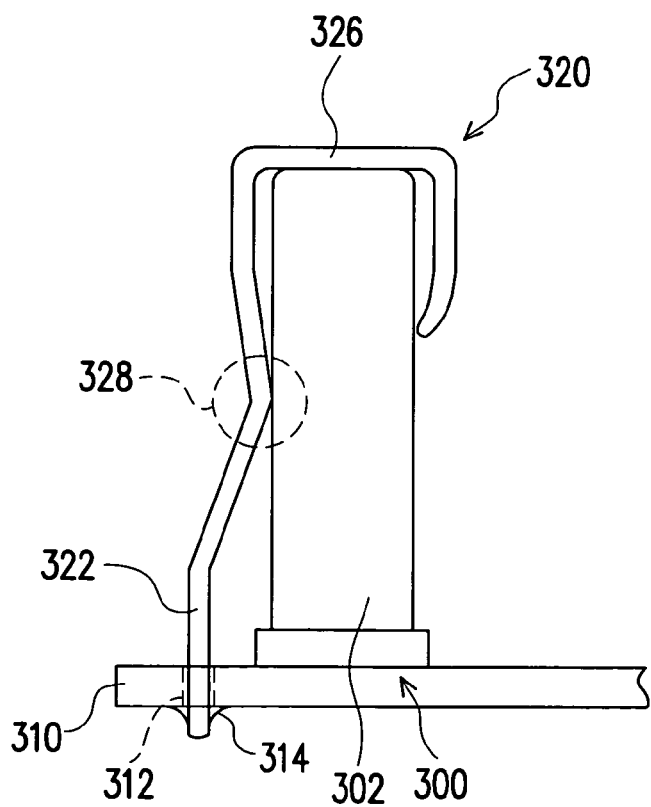

Following are the descriptions of a structure of an asymmetric metallic inserting component. FIGS. 4A and 4B are schematic drawings showing another external metal inserting component before and after assembling, respectively. The metallic inserting component can be, for example, an asymmetric metallic inserting component 320, which is formed by a first lead 322 and a cover 326. The first lead 322 is inserted into an inserting hole 312 of the circuit board 310 and is electrically connected to the ground terminal of the circuit board 310 by a solder 314. The cover 326 can be, for example, an inverted U-shaped cover or a cover with some other shape, suitable for covering the top of the metallic shell 302 of the electronic device 300 so that the asymmetric metallic inserting component 320 can tightly clip onto the metallic shell 302 and electrically connect with the metallic shell 302. Additionally, the connecting part of the cover 326 with the first lead 322 can form a bended part 328, which contacts an inner surface of a sidewall of the metallic shell 302. Although the metallic inserting component 320 is an asymmetric structure, it can clip on the sidewall of the metallic shell and provide good electrical connection.

Accordingly, the shielding apparatus for the electronic device is applied in circuit boards, network cards or displaying cards with oscillating devices, active devices or passive devices for reducing noises and maintaining high transmission quality. Therefore, the present invention has following advantages:

(1) For reducing or eliminating the electromagnetic interference, the present invention uses metallic inserting component electrically connecting the metallic shell of the electronic device and the circuit board for reducing noises resulting from electromagnetic interference.

(2) The metallic inserting component is a low cost component and does not need high-temperature welding for fixing. It can substantially reduce the manufacturing costs and processing time compared to the prior art manual welding or direct soldering operations. Moreover, it also resolves the low-yield issue as the result of bad soldering contact.

(3) The metallic inserting component can be securely disposed on the metallic shell such that it does not come loose during oscillation tests and provide good electric connection with the metallic shell for improving the reliability of the assembly.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A shielding apparatus, for an electronic device, adapted to be disposed on a circuit board, the circuit board having a ground terminal, the shielding apparatus comprising:
   an electronic device, disposed on the circuit board, the electronic device having a metallic shell, whose surface is a ground surface of the electronic device; and
   a metallic inserting component, comprising a first lead and a second lead, which are separately soldered on the ground terminal of the circuit board, the first and the second leads located on two sides of the metallic shell of the electronic device, a top of the metallic inserting component having an inverted U-shaped cover, which connects the first and the second leads through a first and a second inwardly bended clipping parts respectively, the inverted U-shaped cover contacting the top of the metallic shell and the first and second clipping parts clipping on the two sides of the metallic shell.

2. The shielding apparatus for an electronic device of claim 1, wherein the inverted U-shaped cover, the first and the second clipping parts, and the first and the second leads are integrally formed.

3. The shielding apparatus for an electronic device of claim 1, wherein materials of the inverted U-shaped cover, the first and the second clipping parts, and the first and the second leads are selected from a group consisting of tinplate, nickel silver copper and other metal with good adhesion to tin.

4. The shielding apparatus for an electronic device of claim 1, wherein the electronic device is an oscillating device, an active device or a passive device.

5. A metallic inserting component for preventing electromagnetic interference, adapted to connect an electronic device with a circuit board, the electronic device disposed on a surface of the circuit board, the electronic device having a metallic shell, the circuit board having a ground terminal, the electromagnetic-interference-proof metallic inserting component comprising:
   a first lead, correspondingly inserting into an inserting hole of the circuit board and electrically connecting with the ground terminal of the circuit board by a solder;
   an inwardly bonded clipping part, clipping on a side of the metallic shell; and
   a cover, covering a top of the metallic shell, and connecting with the first lead through the clipping part.

6. The metallic inserting component of claim 5, wherein the first lead, the clipping part and the cover are integrally formed.

7. The metallic inserting component of claim 5, wherein materials of the first lead, the clipping part and the cover are selected from a group consisting of tinplate, nickel silver copper and the other metal with good adhesion to tin.

8. The metallic inserting component of claim 5, wherein the cover has a substantial inverted U-shape.

* * * * *